(12) United States Patent (10) Patent No.: US 12,575,202 B2
Lu et al. (45) Date of Patent: Mar. 10, 2026

(54) IMAGE SENSOR AND METHOD OF FORMING THE SAME

(71) Applicant: Taiwan Semiconductor Manufacturing Company, Ltd., Hsinchu (TW)

(72) Inventors: Chun-Liang Lu, Tainan (TW); Ming-Hsien Yang, Taichung (TW); Chun-Hao Chou, Tainan (TW); Kuo-Cheng Lee, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 970 days.

(21) Appl. No.: 17/738,031

(22) Filed: May 6, 2022

(65) Prior Publication Data

US 2023/0361140 A1 Nov. 9, 2023

(51) Int. Cl.
 H10F 39/18 (2025.01)
 H10F 39/00 (2025.01)
(52) U.S. Cl.
 CPC ....... H10F 39/8053 (2025.01); H10F 39/024 (2025.01); H10F 39/18 (2025.01); H10F 39/802 (2025.01); H10F 39/811 (2025.01)
(58) Field of Classification Search
 CPC .... H10F 39/8053; H10F 39/024; H10F 39/18; H10F 39/802; H10F 39/811; H10F 39/182; H10F 39/1825
 See application file for complete search history.

(56) References Cited

U.S. PATENT DOCUMENTS

| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |

OTHER PUBLICATIONS

SiC pinpin photonic filters for linking the visible spectrum to the telecom gap, Jul. 21, 2014, Microelectronic Engineering 126 (2014) 179-183 (Year: 2014).*

* cited by examiner

*Primary Examiner* — Tucker J Wright
(74) *Attorney, Agent, or Firm* — JCIPRNET

(57) ABSTRACT

Provided is an image sensor and a method of forming the same. The image sensor includes a first substrate having a first surface and a second surface opposite to each other; a plurality of photodetectors, disposed in the first substrate; and a plurality of color filters, disposed on the second surface of the first substrate and respectively corresponding to the plurality of photodetectors. The plurality of color filters are composed of a plurality of PIN diodes, and the plurality of PIN diodes are configured to absorb light of different wavelength ranges by applying different bias voltages.

20 Claims, 15 Drawing Sheets

20

IMAGE SENSOR AND METHOD OF FORMING THE SAME

BACKGROUND

Many modern electronic devices (e.g., digital cameras, optical imaging devices, etc.) comprise image sensors. Image sensors convert optical images to digital data that may be represented as digital images. An image sensor includes an array of pixel sensors, which are unit devices for the conversion of an optical image into digital data. Some types of pixel sensors include charge-coupled device (CCD) image sensors and complementary metal-oxide-semiconductor (CMOS) image sensors (CISs). Compared to CCD image sensors. CISs are favored due to, among other things, low power consumption, small size, fast data processing, a direct output of data, and low manufacturing cost.

Although existing CISs and methods for forming the same have been generally adequate for their intended purpose, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
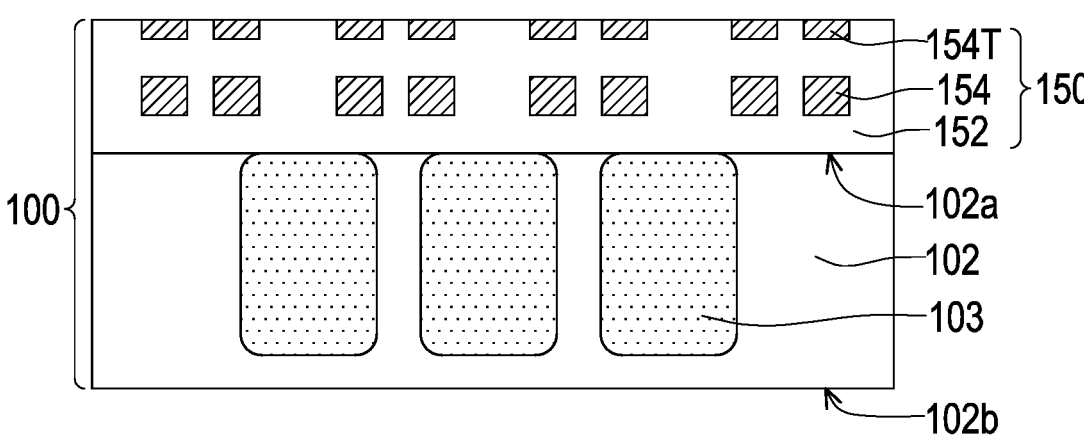
FIG. 1A to FIG. 1J are cross-sectional views of a method of forming a semiconductor structure having an image sensor in accordance with some embodiments.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath." "below." "lower." "above." "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Some complementary metal-oxide semiconductor image sensors (CISs) have an array of pixel sensors. A pixel sensor of the array of pixel sensors comprises an array of photo-detectors (e.g., a 2×2 photodetector array) disposed in a semiconductor substrate. In some embodiments, the photo-detectors may be separated from one another by an isolation structure (e.g., a full-depth isolation structure). Further, the pixel sensor comprises a plurality of pixel devices (e.g., a transfer gate, a reset transistor, a source follower transistor, and/or a row-select transistor) that are disposed on an active region of the semiconductor substrate. An interconnect structure overlies the semiconductor substrate and the pixel devices, and electrically couples the photodetectors and the pixel devices together, such that the pixel sensor may function properly. The pixel sensor records incident radiation (e.g., photons) using the photodetectors and facilitates digital readout of the recording with the pixel devices.

In addition, CISs further include light filters (e.g., color filters, infrared (IR) filters, etc.) arranged over the photode-tectors and configured to filter incident light provided to different photodetectors within the CISs. Upon receiving light, the photodetectors are configured to generate electric signals corresponding to the received light. The electric signals from the photodetectors can be processed by a signal processing unit to determine an image captured by the CISs. Quantum efficiency (QE) is a ratio of the numbers of photons that contribute to an electric signal generated by a photodetector within a pixel region to the number of photons incident on the pixel region.

In accordance with some embodiments, a plurality of PIN diodes are used to replace traditional color filters, thereby enhancing the quantum efficiency of CISs. Further, the PIN diodes have a thinner thickness than that of the traditional color filters. As such, the CISs that use the PIN diodes to filter incident light are more meet the trend of current compact electronic products.

FIG. 1A to FIG. 1J are cross-sectional views of a method of forming a semiconductor structure having an image sensor in accordance with some embodiments.

Referring to FIG. 1A, an integrated circuit (IC) 100 is provided. In detail, the IC 100 may include a first substrate 102 and a first interconnect structure 150 on the first substrate 102. The first substrate 102 may have a first surface (e.g., front side or active surface) 102a and a second surface (e.g., back side) 102b opposite to each other. In some embodiments, the first substrate 102 may be a semiconductor substrate, such as a bulk semiconductor, a semiconductor-on-insulator (SOI) substrate, or the like, which may be doped (e.g., with a p-type or an n-type dopant) or undoped.

Generally, the SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. For example, the first substrate 102 is a wafer, such as a silicon wafer. The first substrate 102 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Alternatively, a plurality of electrical components, such as photodetectors, transistors, resistors, capacitors, inductors, diodes, or the like, may formed in a device region of the first substrate 102 in the front-end-of-line (FEOL) processing of semiconductor manufacturing. For example, as shown in FIG. 1A, a plurality of photodetectors (e.g., photodiodes) 103 are formed in the first substrate 102. The photodetectors 103 are configured to absorb incident radiation (e.g., photons) and generate electrical signals corresponding to the incident radiation. In some embodiments, the electrical components may be formed in/on the first substrate 102 using any suitable formation method known or used in semiconductor manufacturing. The electrical components may be readout transistors (not shown), such as reset transistors, source follower transistors, row-select transistors, or the like. In some embodiments, the readout transistor may be, for example, a metal-oxide semiconductor field-effect transistor (MOSFET), a bipolar junction transistor (BJT), a high-electron-mobility transistor (HEMTs), or the like.

As shown in FIG. 1A, the first interconnect structure 150 is formed on the first surface 102a of the first substrate 102. In some embodiments, the first interconnect structure 150 may be configured to electrically couple devices (e.g., transistors, the photodetectors 103, etc.) to one another. Specifically, the first interconnect structure 150 may include a dielectric layer 152 and a conductive layer 154.

In some embodiments, the dielectric layer 152 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the dielectric layer 152 includes low-k dielectric materials that have a dielectric constant less than 4. Examples of low-k dielectric materials include BLACK DIAMOND® (Applied Materials of Santa Clara, Calif.), Xerogel. Aerogel, amorphous fluorinated carbon, Parylene, BCB (bis-benzocyclobutenes), Flare, SILK® (Dow Chemical, Midland. Mich.), hydrogen silsesquioxane (HSQ) or fluorinated silicon oxide (SiOF), and/or a combination thereof. In alternative embodiments, the dielectric layer 152 include one or more dielectric materials. In some embodiments, the dielectric layer 152 is formed by any suitable method, such as chemical vapor deposition (CVD), spin-on, or the like. Although the dielectric layer 152 illustrated in FIG. 1A is a single-layered structure, the embodiments of the present disclosure are not limited thereto. In other embodiments, the dielectric layer 152 may be a bi-layered structure or multi-layered structure.

The conductive layer 154 is formed in the dielectric layer 152. In some embodiments, the conductive layer 154 may be a conductive line, a conductive circuit, or the like, so as to electrically connect the electrical components in/on the first substrate 102. The conductive layer 154 may include a seed layer and a metal layer on the seed layer. The seed layer may be a conformal layer lining the sidewalls and the bottom surface of the metal layer. In some embodiments, the seed layer may be a single layer or a composite layer including a plurality of sub-layers formed of different materials. For example, the seed layer is a titanium/copper composited layer. The metal layer may include a metal material, such as Al, Cu, W, Co, Pd. Pt. Ni, other low resistivity metal constituent, an alloy thereof, or a combination thereof, and are formed by an electroplating process. In addition, a barrier layer may be formed between the conductive layer 154 and the dielectric layer 152 to separate the conductive layer 154 from the dielectric layer 152 and prevent the metal atoms (e.g., Cu, Co. W. or Al atoms) of the conductive layer 154 from diffusing into the dielectric layer 152. The barrier layer may include Ti. TIN, Ta, TaN, an alloy thereof, or a combination thereof. In some embodiments, the barrier layer and the conductive layer 154 are formed by a single damascene process, which includes performing a lithography and etching process to form a trench in the dielectric layer 152, lining the trench with a barrier material, filling the trench with a conductive material, and performing a planarization process to remove excess the conductive and barrier materials, so that the barrier layer, the top conductive layer 154T, and the dielectric layer 152 have substantially planar surfaces. In some alternative embodiments, the barrier layer and the conductive layer 154 are formed by a dual damascene process.

In some embodiments, the IC 100 may be a wafer including a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), an application-specific die (e.g., an application-specific integrated circuit (ASIC), a field-programmable gate array (FPGA), etc.), the like, or combinations thereof.

Figure 1B:
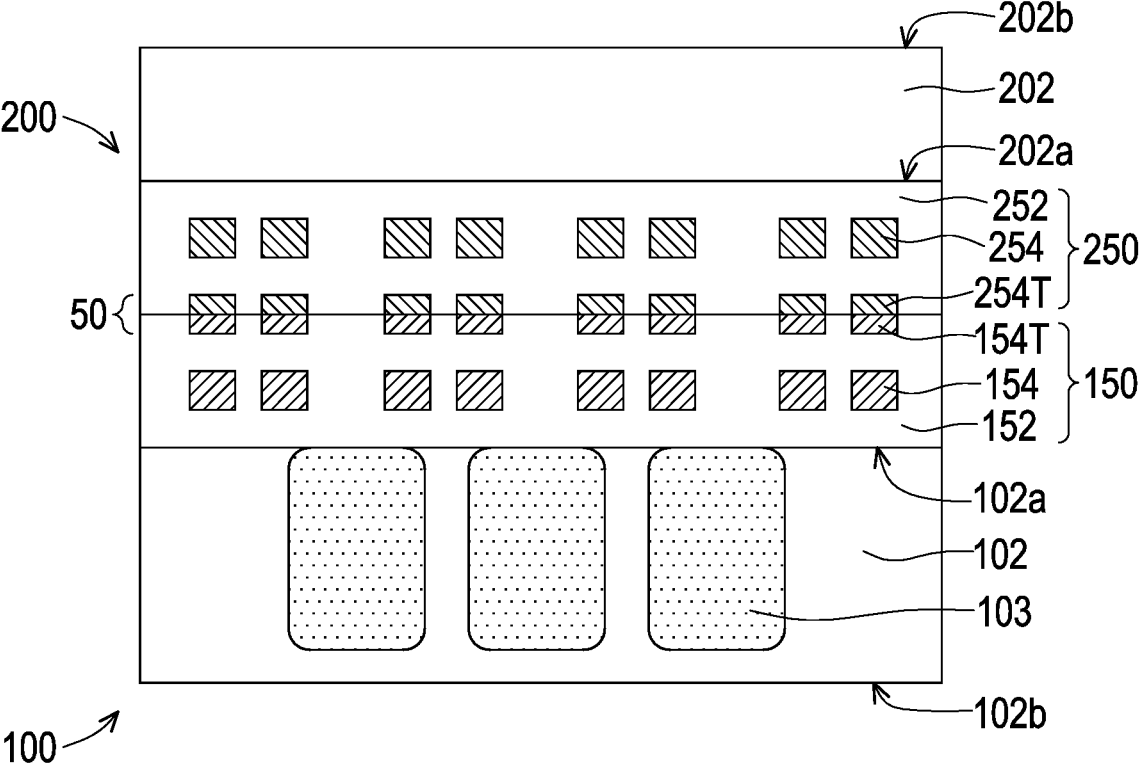

Referring to FIG. 1B, another IC 200 is provided to bond onto the IC 100. In some embodiments, the IC 200 may be a wafer including a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), an application-specific die (e.g., an application-specific integrated circuit (ASIC), a field-programmable gate array (FPGA), etc.), the like, or combinations thereof. In the embodiment, the IC 200 is different from the IC 100. For example, the IC 100 may be a CMOS image sensor wafer and the IC 200 may be an ASIC wafer.

Specifically, the IC 200 may include a second substrate 202 and a second interconnect structure 250 over the second substrate 202. The second substrate 202 may have a first surface (e.g., front side or active surface) 202a and a second surface (e.g., back side) 202b opposite to each other. In some embodiments, the second substrate 202 may be a semiconductor substrate, such as a bulk semiconductor, a semiconductor-on-insulator (SOI) substrate, or the like, which may be doped (e.g., with a p-type or an n-type dopant) or undoped. Generally, the SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. For example, the second substrate 202 is a wafer, such as a silicon wafer. The second substrate 202 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GalnAs, GalnP, and/or GaInAsP; or combinations thereof. Other substrates, such as multi-layered or gradient substrates, may also be used. Alternatively, a plurality of electrical components, such as photodetectors, transistors, resistors, capacitors, inductors, diodes, or the like, may formed in a device region of the second substrate 202 in the front-end-of-line (FEOL) processing of semiconductor manufacturing. In some embodiments, the electrical components may be formed in/on the second substrate 202 using any suitable formation method known or used in semiconductor manufacturing.

As shown in FIG. 1B, the second interconnect structure 250 is formed on the first surface 202a of the second substrate 202. Specifically, the second interconnect structure 250 may include a dielectric layer 252 and a conductive layer 254. The configuration, material, and function of the dielectric layer 252 and the conductive layer 254 are similar to those of the dielectric layer 152 and the conductive layer 154 and have been described in the above embodiment, thus the details are omitted herein. For clarity, the top conductive layer exposed by the dielectric layer 252 are labeled as "254T".

As shown in FIG. 1B, the IC 200 is further turned upside down and mounted onto the IC 100. In detail, the IC 100 and the IC 200 are face-to-face bonded together via the first interconnect structure 150 and the second interconnect structure 250. In some embodiments, before the IC 200 is bonded to the IC 100, the first interconnect structure 150 and the second interconnect structure 250 are aligned, so that the top conductive layer 154T may be bonded to the top conductive layer 254T. In some embodiments, the alignment of the top conductive layer 154T and the top conductive layer 254T may be achieved by using an optical sensing method. After the alignment is achieved, the first interconnect structure 150 and the second interconnect structure 250 are bonded together by a hybrid bonding process to form a hybrid bonding structure 50. In this case, the top conductive layer 154T may be in direct contact with the top conductive layer 254T and the dielectric layer 152 may be in direct contact with the dielectric layer 252.

In some embodiments, the first interconnect structure 150 and the second interconnect structure 250 are hybrid bonded together by the application of pressure and heat. It is noted that the hybrid bonding process involves at least two types of bonding process, including metal-to-metal bonding and non-metal-to-non-metal bonding such as dielectric-to-dielectric bonding or fusion bonding. As shown in FIG. 1B, the hybrid bonding structure 50 includes the top conductive layer 154T and the top conductive layer 254T bonded by metal-to-metal bonding, and the dielectric layer 152 and the dielectric layer 252 bonded by non-metal-to-non-metal bonding.

Figure 1C:
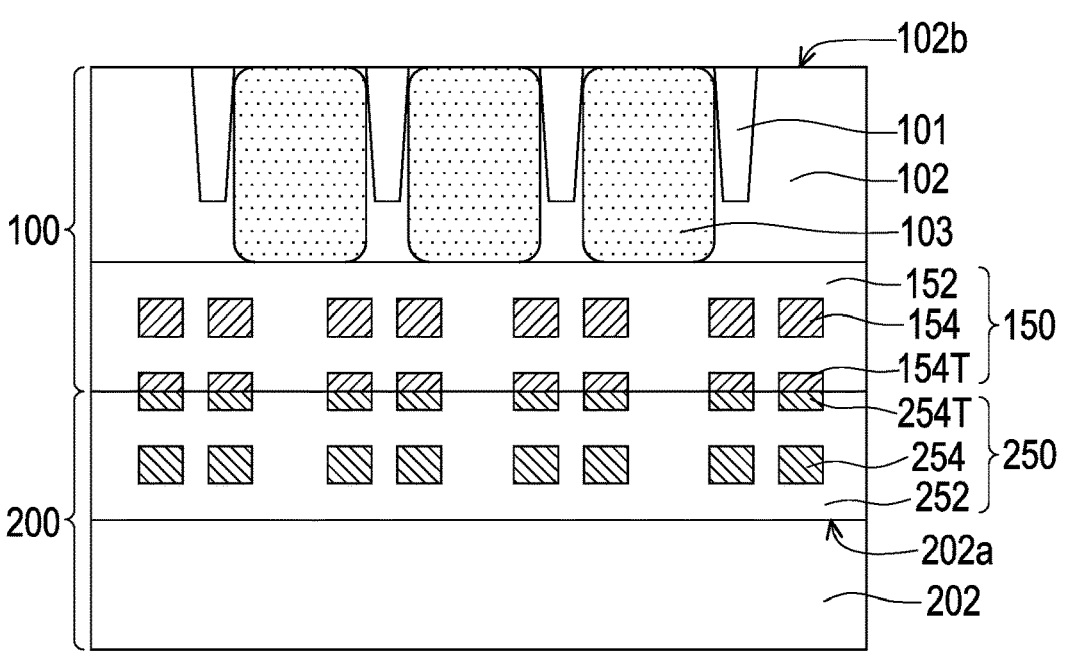

Referring to FIG. 1C, after performing the hybrid bonding process, the first substrate 102 of the IC 100 is thinned or grinded until the photodetectors 103 are exposed or almost exposed at the second surface 102b. In addition, a plurality of isolation structures 101 may be formed in the first substrate 102. The isolation structures 101 may laterally surround the photodetectors 103 in a top view to decrease scattering of light. In some embodiments, the first substrate 102 may be thinned before or after the isolation structures 101 are formed in the first substrate 102.

In some embodiments, a process for forming the isolation structures 101 includes selectively etching the first substrate 102 to form a plurality of isolation structure openings in the first substrate 102 that extends into the first substrate 102 from the second surface 102b of the first substrate 102, and subsequently filling the isolation structure openings (e.g., by CVD, PVD, ALD, thermal oxidation, sputtering, etc.) with a dielectric material. In further embodiments, the first substrate 102 is selectively etched by forming a masking layer (not shown) on the second surface 102b of the first substrate 102, and subsequently exposing the first substrate 102 to an etchant configured to selectively remove unmasked portions of the first substrate 102. In further embodiments, the dielectric material may include an oxide (e.g., Si (2), a nitride, a carbide, or the like. In yet further embodiments, a planarization process (e.g., CMP) may be performed into the dielectric material and the first substrate 102 to form a substantially planar surface. That is, the first substrate 102, the photodetectors 103, and the isolation structures 101 may have substantially planar top surfaces.

Figure 1D:
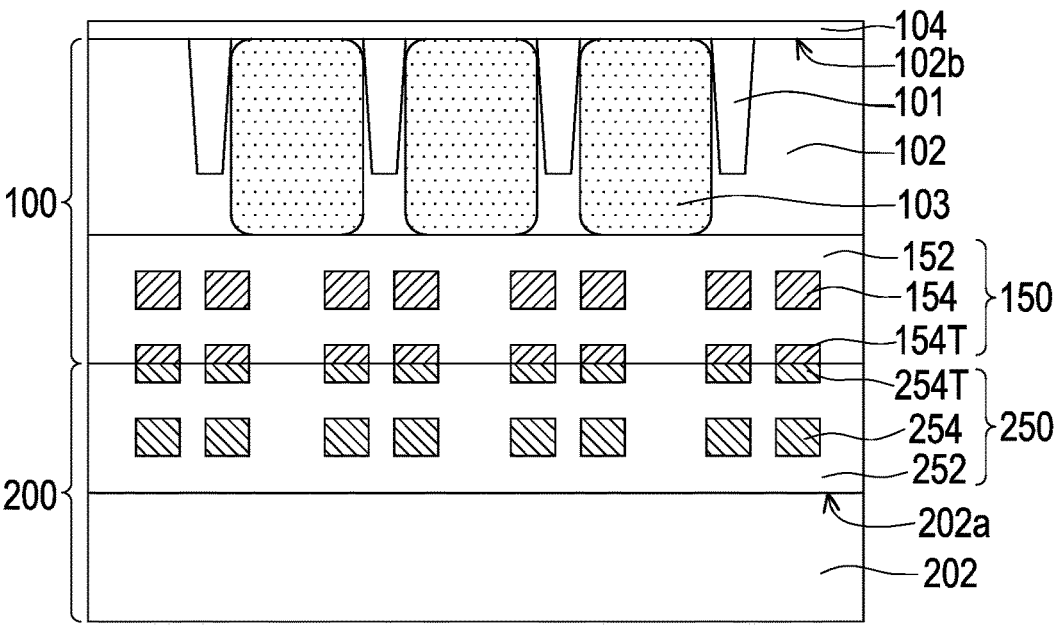

Referring to FIG. 1D, a pad dielectric layer (e.g., oxide layer) 104 is optionally formed on the second surface 102b of the first substrate 102, so that the pad dielectric layer 104 covers the first substrate 102, the photodetectors 103, and the isolation structures 101. In some alternative embodiments, the pad dielectric layer 104 may be omitted, so that the subsequently formed PIN diodes may be in direct contact with the second surface 102b of the first substrate 102.

Figure 1E:
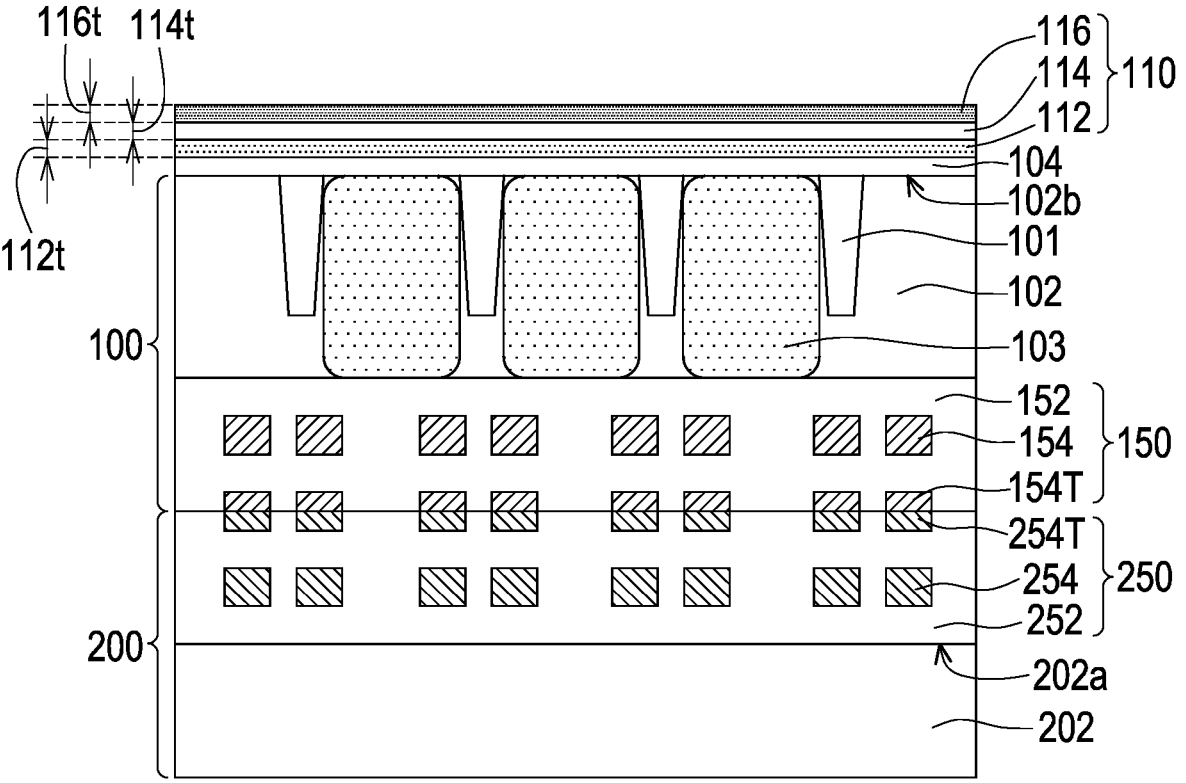

Referring to FIG. 1E, a stack layer 110 is formed on the second surface 102b of the first substrate 102 by any suitable deposition method, such as chemical vapor deposition (CVD) or the like. In some embodiments, the stack layer 110 covers the first substrate 102, the photodetectors 103, and the isolation structures 101, so that the pad dielectric layer 104 is sandwiched between the second surface 102b of the first substrate 102 and the stack layer 110. In detail, the stack layer 110 may include a lower doped material layer 112, an intrinsic material layer 114, and an upper doped material layer 116. In some embodiments, the lower doped material layer 112 may include a semiconductor material with a first conductivity type. For example, the lower doped material layer 112 may be P-type silicon or silicon germanium layer, and may have a thickness 112t of 40 nm to 80 nm. In some embodiments, the upper doped material layer 116 is disposed over the lower doped material layer 112, and may include a semiconductor material with a second conductivity type different from the first conductivity type. For example, the upper doped material layer 116 may be N-type silicon or silicon germanium layer, and may have a thickness 116t of 10 nm to 50 nm. In some embodiments, the intrinsic material layer 114 is disposed between the lower doped material layer 112 and the upper doped material layer 116, and in direct contact with the lower doped material layer 112 and the upper doped material layer 116 to form a p-i-n junction. For example, the intrinsic material layer 114 may include intrinsic, undoped or unintentionally doped semiconductor material such as monocrystalline silicon or silicon germanium, and may have a thickness 114$t$ of 30 nm to 80 nm.

Figure 1F:
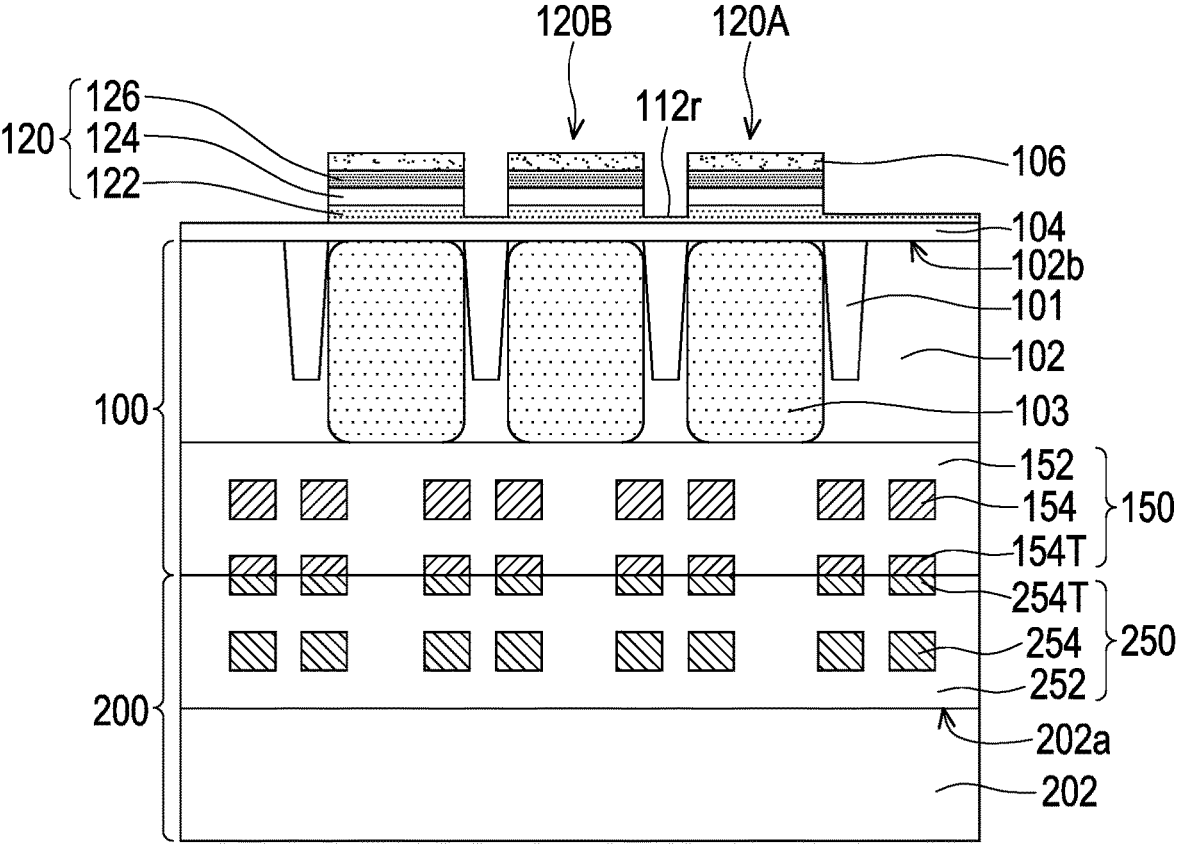

Referring to FIG. 1E and FIG. 1F, the stack layer 110 is pattered to form a plurality of color filters 120 respectively corresponding to the photodetectors 103 in the first substrate 102. It should be noted that, in the present embodiment, the color filters 120 are formed or composed of a plurality of PIN diodes (hereinafter called "PIN diodes 120"). Therefore, the PIN diodes 120 may be configured to absorb light of different wavelength ranges by applying different bias voltages. That is, in the present embodiment, the PIN diodes 120 may be used to replace the traditional color filters to more flexibly control the number of photons transmitted to the photodetectors 103, thereby enhancing the quantum efficiency of CISs. Further, the PIN diodes 120 have a thinner thickness than that of the traditional color filters. As such, the CISs that use the PIN diodes 120 to filter incident light are more meet the trend of current compact electronic products.

Figure 2:
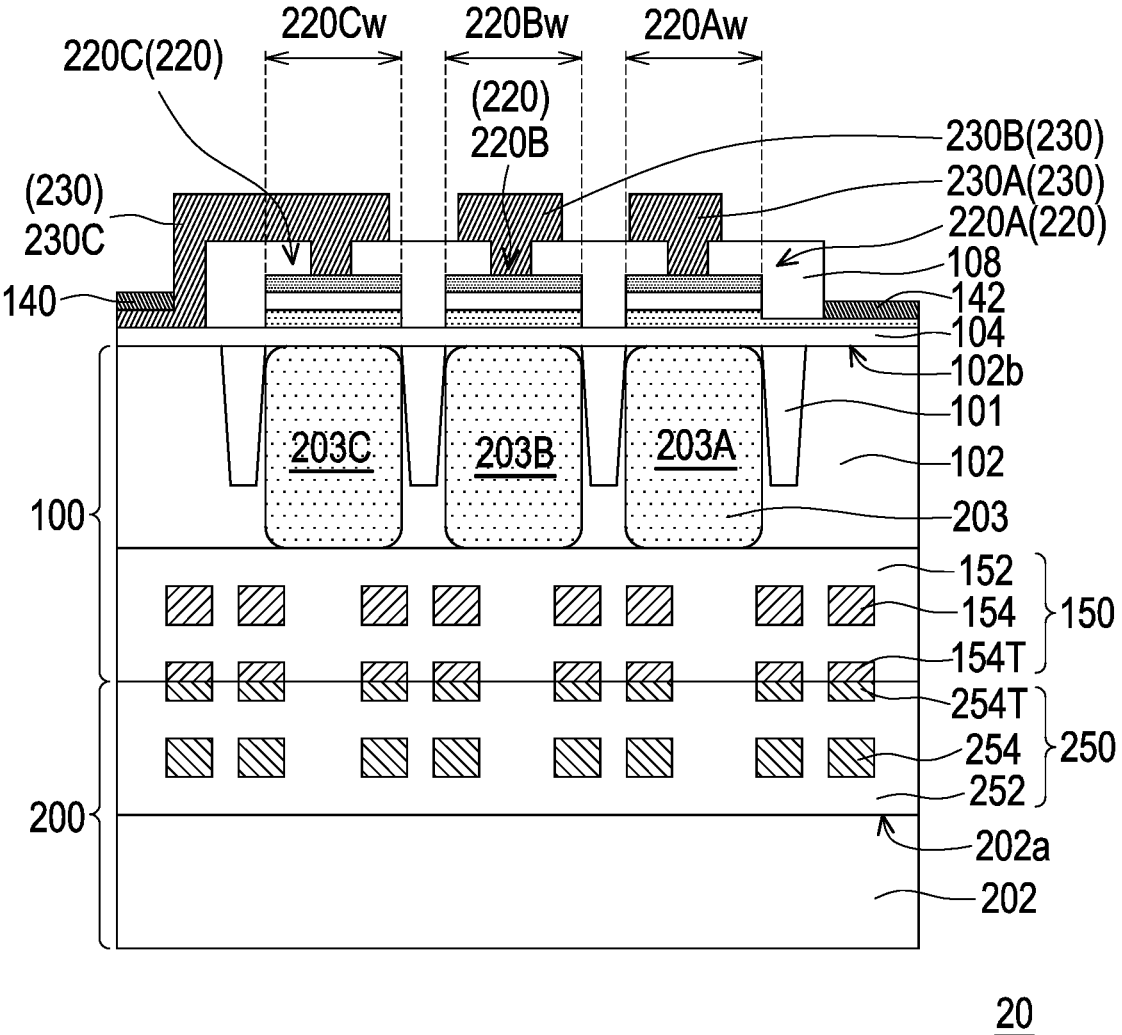
FIG. 2 is a cross-sectional view of a semiconductor structure having an image sensor in accordance with some alternative embodiments.

Specifically, the steps of patterning the stack layer 110 may include: forming a photoresist pattern 106 on the stack layer 110; and then performing an etching process by using the photoresist pattern 106 as an etch mask to remove a portion of the stack layer 110. In some embodiments, the etching process includes a dry etching process, such as a reactive ion etching (RIE) process. After the stack layer 110 is patterned, as shown in FIG. 1F, the upper doped material layer 116 may be divided as a plurality of upper doped layers 126, the intrinsic material layer 114 may be divided as a plurality of intrinsic layers 124, and the lower doped material layer 112 may be divided as a plurality of lower doped layers 122. In some embodiments, the remaining lower doped material layer 112$r$ may remain between two adjacent lower doped layers 122 of two adjacent PIN diodes 120A and 120B, so that the lower doped layers 122 of the PIN diodes 120A and 120B are electrically connected to each other, as shown in FIG. 1F. In this case, the remaining lower doped material layer 112$r$ may be referred to as connect portion 112$r$. The connect portion 112$r$ may be electrically connected to some PIN diodes transmitting light in the same wavelength range, so as to apply the same bias voltage to the said PIN diodes. However, the embodiments of the present disclosure are not limited thereto, in some alternative embodiments, no remaining lower doped material layer remains between two adjacent lower doped layers 122, so that the lower doped layers of the PIN diodes 220A, 220B, and 220C are electrically isolated from each other, as shown in FIG. 2.

In some embodiments, the magnitude of the applied bias voltage may be controlled by adjusting N-type or P-type doping concentration in the upper doped layers 126 or the lower doped layers 122 of the PIN diodes 120. The wavelength range of light absorption by the PIN diodes 120 may also depend on the semiconductor material of the PIN diodes 120. That is, the PIN diodes 120 with different semiconductor materials may absorb light in different wavelength ranges.

Figure 1G:
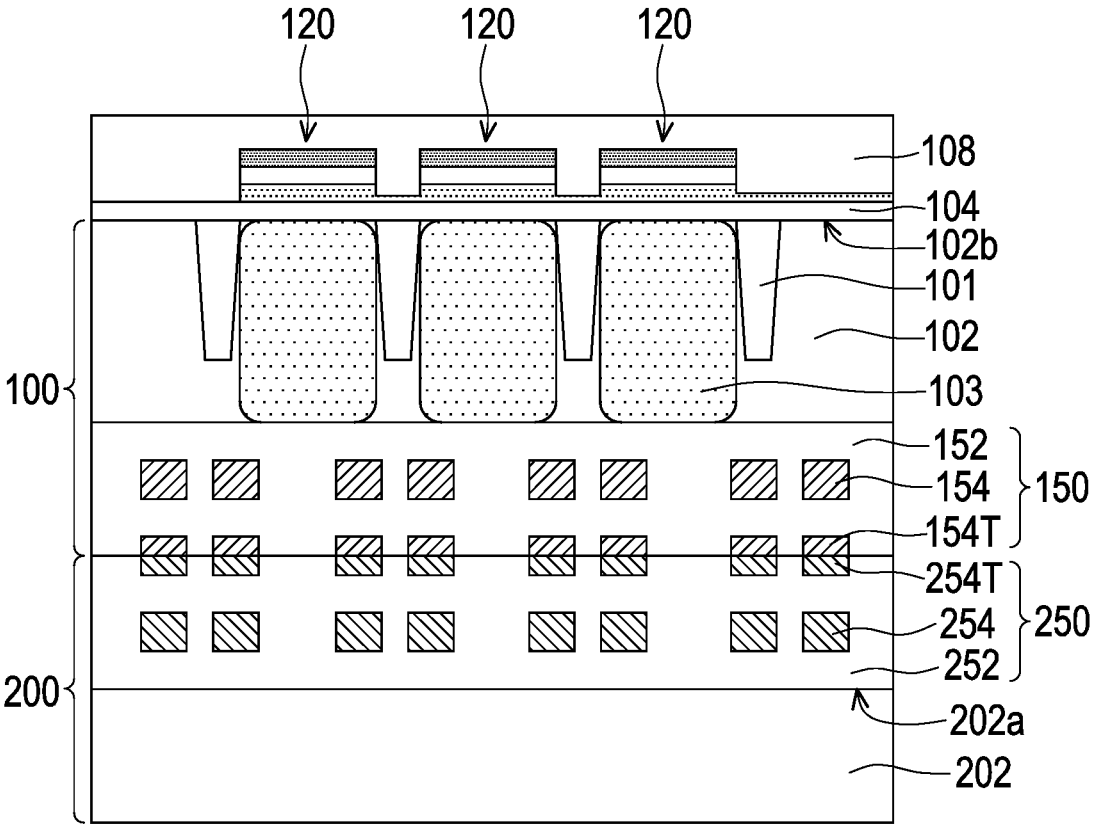

Referring to FIG. 1G, after removing the photoresist pattern 106, a dielectric layer 108 is formed on the second surface 102$b$ of the first substrate 102 to encapsulate the PIN diodes 120. In some embodiments, the dielectric layer 108 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the dielectric layer 108 includes low-k dielectric materials that have a dielectric constant less than 4. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK®(Dow Chemical, Midland, Mich.), hydrogen silsesquioxane (HSQ) or fluorinated silicon oxide (SiOF), and/or a combination thereof. In alternative embodiments, the dielectric layer 108 includes one or more dielectric materials. In some embodiments, the dielectric layer 108 is formed by any suitable method, such as chemical vapor deposition (CVD), spin-on, or the like.

Figure 1H:
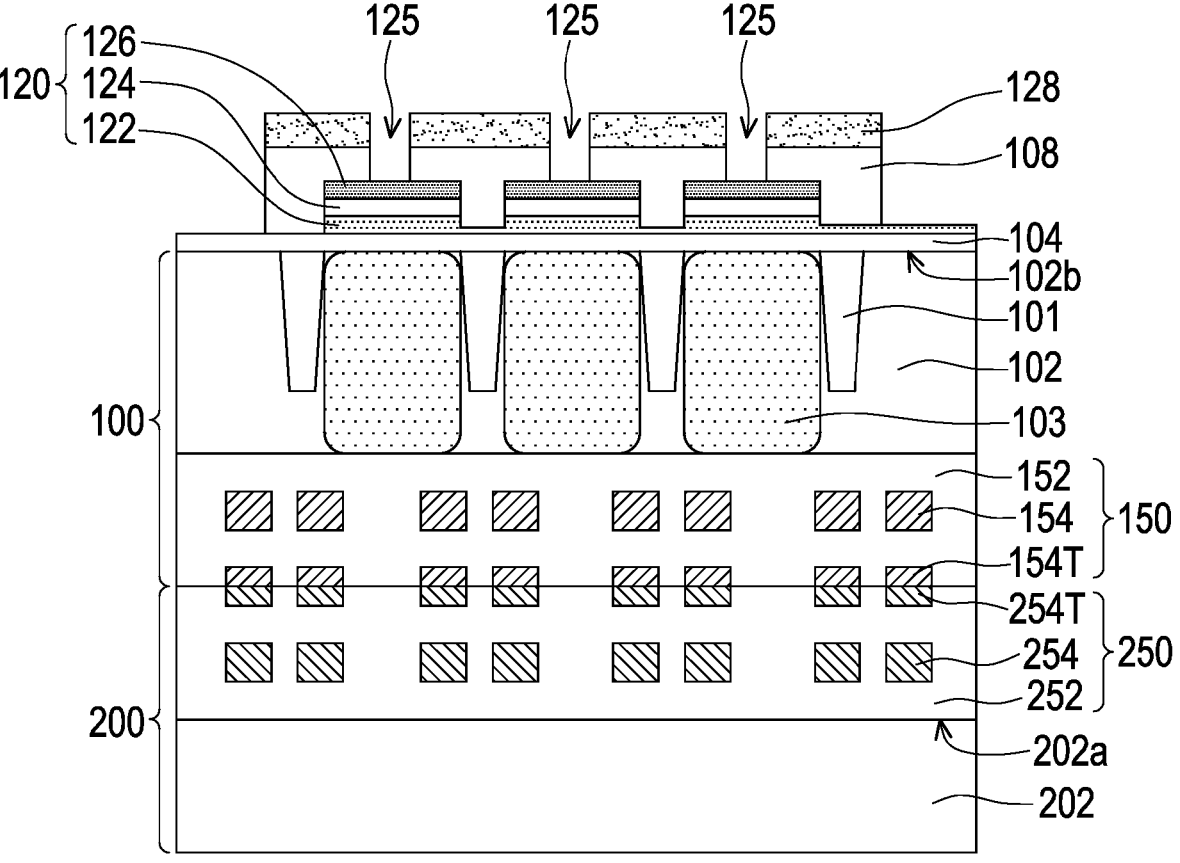

Referring to FIG. 1G and FIG. 1H, the dielectric layer 108 is patterned to form a plurality of openings 125 in the dielectric layer 108. In some embodiments, the openings 125 may expose the upper doped layers 126 of the PIN diodes 120. Specifically, the steps of patterning the dielectric layer 108 may include: forming a photoresist pattern 128 on the dielectric layer 108; and then performing an etching process by using the photoresist pattern 128 as an etch mask to remove a portion of the dielectric layer 108 until the upper doped layers 126 are exposed. In some embodiments, the etching process includes a dry etching process, such as a reactive ion etching (RIE) process.

Figure 1I:
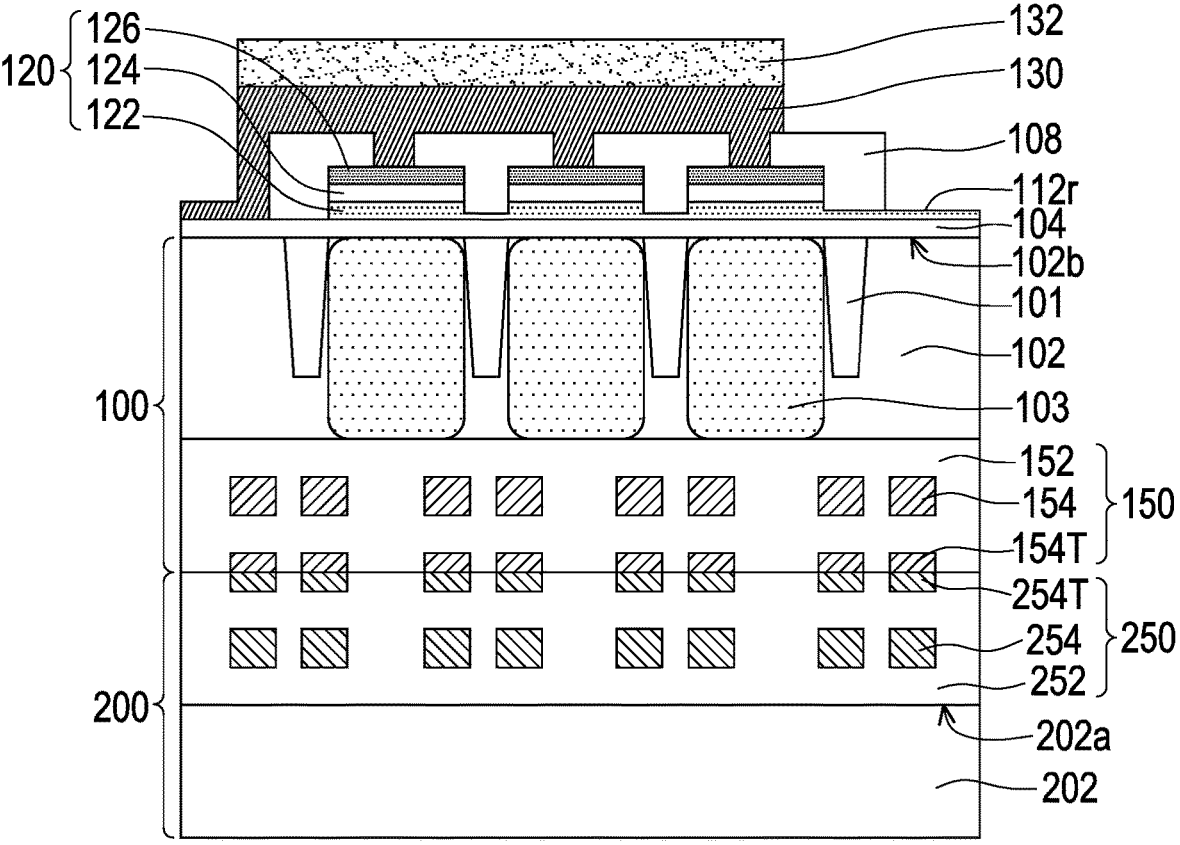

Referring to FIG. 1H and FIG. 1I, after removing the photoresist pattern 128, an electrode layer 130 is formed to fill in the openings 125 and extend to cover a surface of the dielectric layer 108. In some embodiments, the electrode layer 130 may be a transparent electrode including an electrically conductive material that is optically transparent, such as, for example, indium tin oxide (ITO), fluorine tin oxide (FTO), or the like. The electrode layer 130 may be formed by forming a photoresist pattern 132 on the electrode layer 130; and then performing an etching process by using the photoresist pattern 132 as an etch mask to remove a portion of electrode layer 130 until the connect portion 112$r$ is exposed.

Figure 1J:
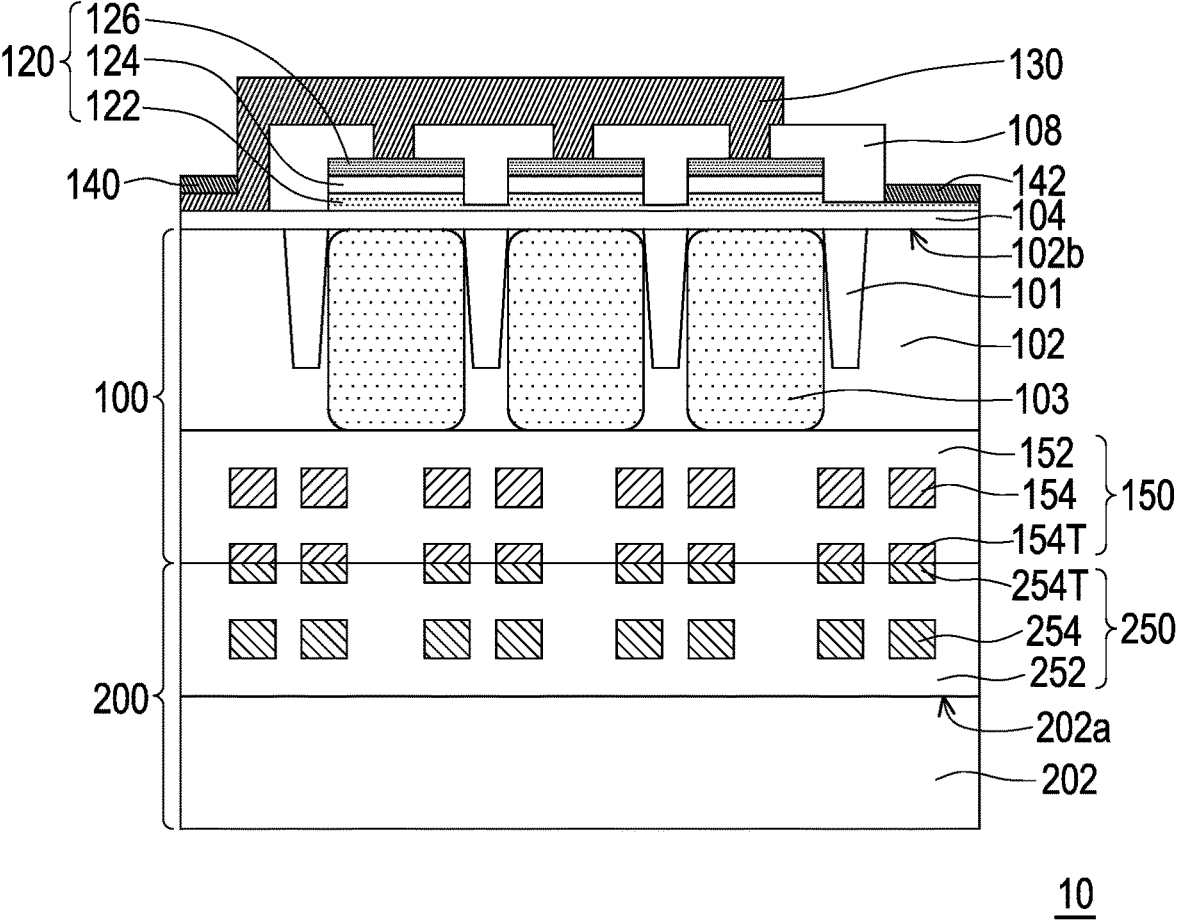

Referring to FIG. 1I and FIG. 1J, after removing the photoresist pattern 132, a first pad 140 is formed on the electrode layer 130 and a second pad 142 is formed on the connect portion 112$r$, thereby accomplishing a semiconductor structure 10. Specifically, the first pad 140 and the second pad 142 are formed by deposing a pad material on the electrode layer 130, the dielectric layer 108, and the connect portion 112$r$, and then patterning the pad material until exposing the electrode layer 130. In this case, the first pad 140 may be electrically connected to the electrode layer 130 for providing voltage to the upper doped layers 126 of the PIN diodes 120, and the second pad 142 may be electrically connected to the connect portion 112$r$ for providing voltage to the lower doped layers 122 of the PIN diodes 120. In some embodiments, the first pad 140 and the second pad 142 may include a metal material, such as Al, Cu. W. Co. Pd. Pt. Ni, other low resistivity metal constituent, an alloy thereof, or a combination thereof, and are formed by any suitable deposition method, such as physical vapor deposition (PVD), an electroplating process, or the like.

FIG. 2 is a cross-sectional view of a semiconductor structure 20 having an image sensor in accordance with some alternative embodiments.

Figure 5A:
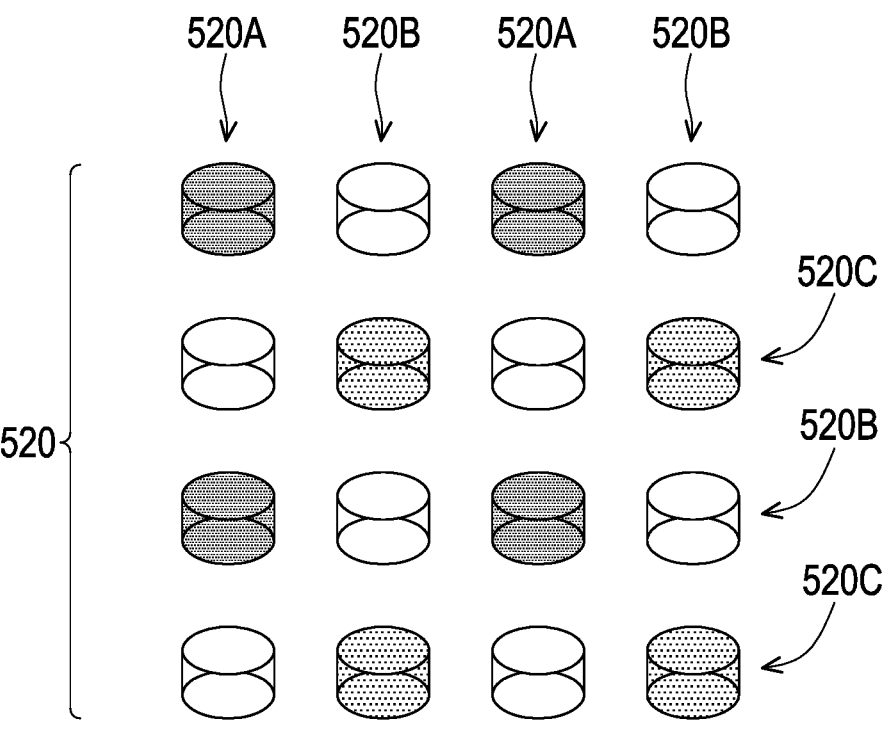
FIG. 5A to FIG. 5D are perspective views of a PIN diode in accordance with various embodiments.

The semiconductor structure 20 of FIG. 2 is similar to the semiconductor structure 10 of FIG. 1J, that is, the configuration, material, and function of the semiconductor structure 20 are similar to those of the semiconductor structure 10, and thus the details are omitted herein. The main difference between the semiconductor structure 20 and the semiconductor structure 10 lies in that the color filters 220 of the semiconductor structure 20 are formed or composed of a plurality of PIN diodes separated from each other (herein-after called "PIN diodes 220"). In detail, the PIN diodes 220 may include a first PIN diode 220A, a second PIN diode 220B, and a third PIN diode 220C. The first PIN diode 220A, the second PIN diode 220B, and the third PIN diode 220C may be physically separated from each other by the dielectric layer 108. In addition, the electrode layer 230 may include a first electrode layer 230A, a second electrode layer 230B, and a third electrode layer 230C physically separated from each other by the dielectric layer 108. The first elec-trode layer 230A may be electrically connected to the first PIN diode 220A, the second electrode layer 230B may be electrically connected to the second PIN diode 220B, and the third electrode layer 230C may be electrically connected to the third PIN diode 220C. That is, the first PIN diode 220A, the second PIN diode 220B, and the third PIN diode 220C are electrically independent of each other. Although FIG. 2 only illustrates three PIN diodes 220, the embodiments of the present disclosure are not limited thereto. In other embodiments, the number of the PIN diodes 220 may be adjusted according to design requirements. In the present embodiment, a plurality of PIN diodes may be arranged in an array of a plurality of rows and a plurality of columns, as shown in FIG. 5A.

As shown in FIG. 2, the first PIN diode 220A may be directly disposed on a corresponding first photodetector 203A, the second PIN diode 220B is may be directly disposed on a corresponding second photodetector 203B, and the third PIN diode 220C is may be directly disposed on a corresponding third photodetector 203C. During operation of the semiconductor structure 20 with the CMOS image sensor, the incident radiation or incident light may be transmitted to the underlying photodetectors 203 through the PIN diodes 220. When the incident radiation or incident light of sufficient energy strikes the photodetectors 203, it generates an electron-hole pair that produces a photocurrent. In some embodiments, the first PIN diode 220A is config-ured to transmit light having a first wavelength range (e.g., red light) to the corresponding first photodetector 203A by applying a first bias voltage, and the first PIN diode 220A may have a width 220Aw of 80 nm to 150 nm. In some embodiments, the second PIN diode 220B is configured to transmit light having a second wavelength range (e.g., green light) to the corresponding second photodetector 203B by applying a second bias voltage, and the second PIN diode 220B may have a width 220Bw of 100 nm to 150 nm. In some embodiments, the third PIN diode 220C is configured to transmit light having a third wavelength range (e.g., blue light) to the corresponding third photodetector 203C by applying a third bias voltage, and the third PIN diode 220C may have a width 220Cw of 60 nm to 150 nm. In the present embodiment, the first bias voltage, the second bias voltage, and the third bias voltage are different from each other. That is, the PIN diodes 220 may be configured to absorb light of different wavelength ranges by applying different bias volt-ages, so as to more flexibly control the number of photons transmitted to the photodetectors 203, thereby enhancing the quantum efficiency of the semiconductor structure 20 with the image sensor.

FIG. 3A to FIG. 3E are cross-sectional views of a PIN diode in accordance with various embodiments.

Figure 3A:
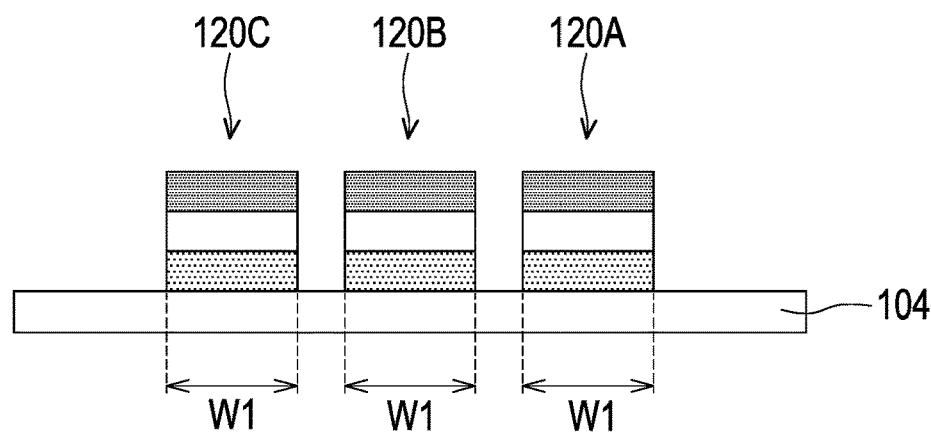
FIG. 3A to FIG. 3E are cross-sectional views of a PIN diode in accordance with various embodiments.
Figure 3B:
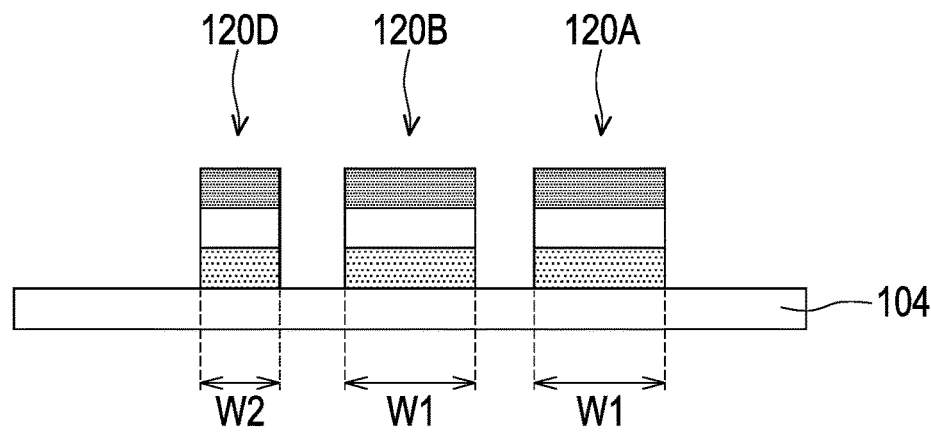
Figure 3C:
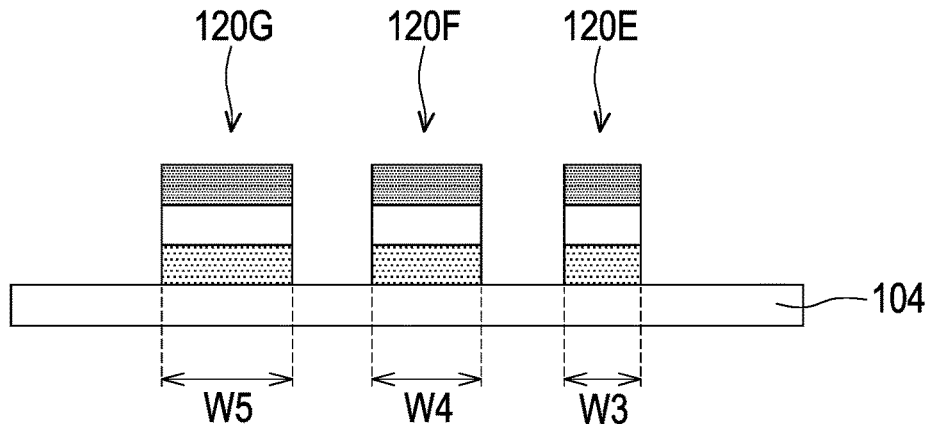
Figure 3D:
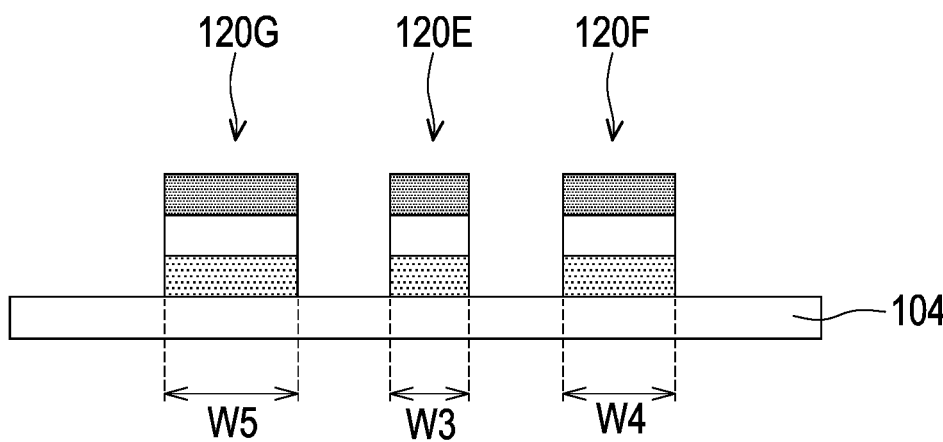
Figure 3E:
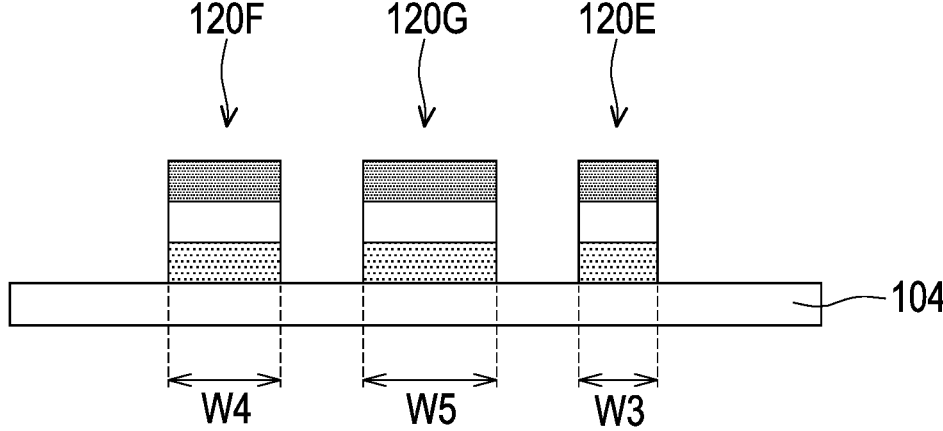

Referring to FIG. 3A, the PIN diodes 120 may include a first PIN diode 120A, a second PIN diode 120B, and a third PIN diode 120C physically separated from each other. In some embodiments, the first PIN diode 120A, the second PIN diode 120B, and the third PIN diode 120C may have the same width W1. However, the embodiments of the present disclosure are not limited thereto, in some alternative embodiments, as shown in FIG. 3B, any two PIN diodes 120A and 120B may have the same width W1, while the other PIN diode 120D may have the width W2 different from the width W1. The width W1 may be greater than or less than the width W2. In some other embodiments, any three PIN diodes 120E. 120F, and 120G may have different widths W3, W4, and W5. For example, as shown in FIG. 3C, the PIN diode 120F with the width W4 is disposed between the PIN diode 120E with the width W3 and the PIN diode 120G with the width W5. In another example, as shown in FIG. 3D, the PIN diode 120E with the width W3 is disposed between the PIN diode 120F with the width W4 and the PIN diode 120G with the width W5. In other examples, as shown in FIG. 3E, the PIN diode 120G with the width W5 is disposed between the PIN diode 120F with the width W4 and the PIN diode 120E with the width W3. The width W5 may be greater than the width W4, and the width W4 may be greater than the width W3.

FIG. 4A to FIG. 4D are cross-sectional views of a PIN diode in accordance with various embodiments.

Figure 4A:
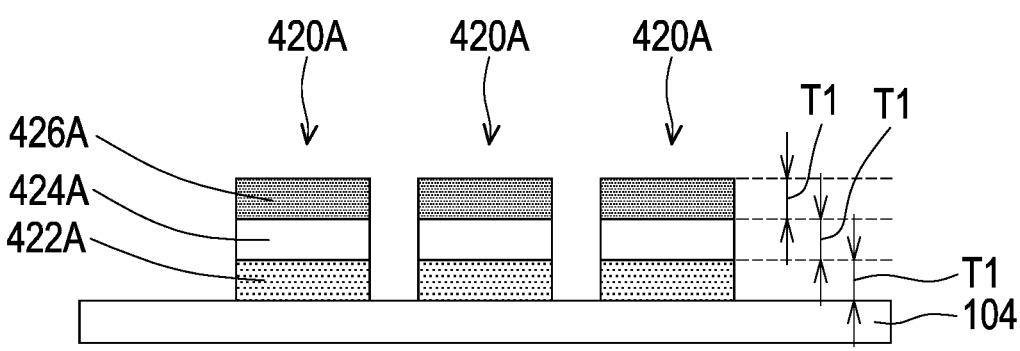
FIG. 4A to FIG. 4D are cross-sectional views of a PIN diode in accordance with various embodiments.
Figure 4B:
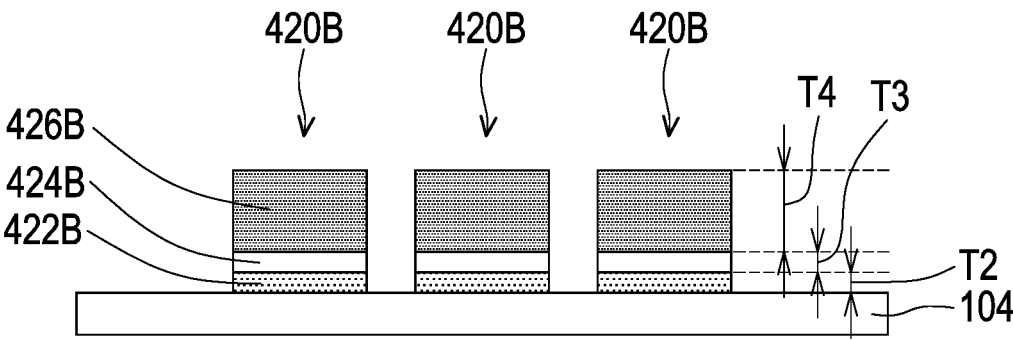
Figure 4C:
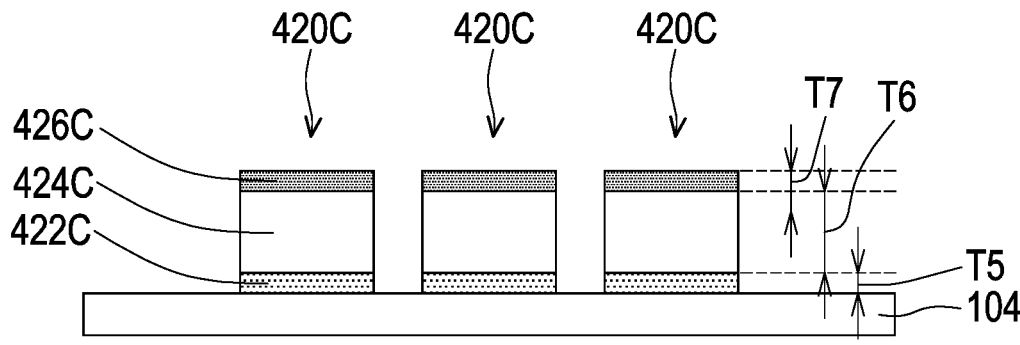
Figure 4D:
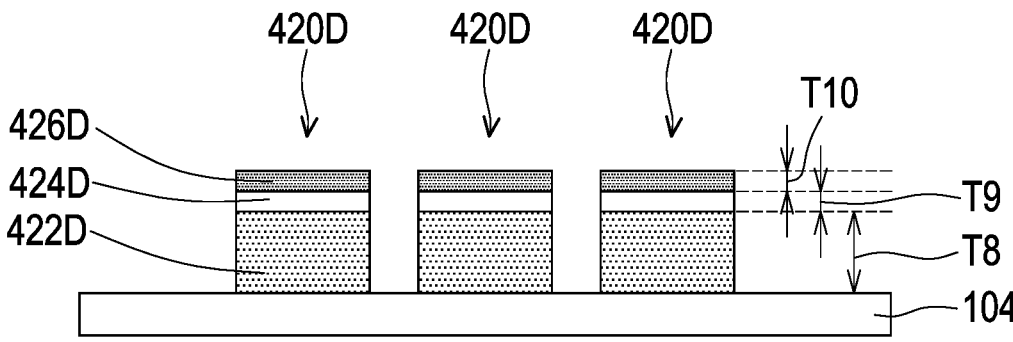

Referring to FIG. 4A, each PIN diode 420A may have a lower doped layer 422A, an upper doped layer 426A, and an intrinsic layer 424A between the lower doped layer 422A and the upper doped layer 426A. In some embodiments, the lower doped layer 422A, the upper doped layer 426A, and the intrinsic layer 424A of each PIN diode 420A have the same thickness T1. However, the embodiments of the pres-ent disclosure are not limited thereto, in some alternative embodiments, as shown in FIG. 4B, the lower doped layer 422B, the upper doped layer 426B, and the intrinsic layer 424B of each PIN diode 420B have different thicknesses T2, T3, and T4. The thickness T4 of the upper doped layer 426B may be greater than the thickness T2 of the lower doped layer 422B and/or the thickness T3 of the intrinsic layer 424B. In some other embodiments, as shown in FIG. 4C, the lower doped layer 422C, the upper doped layer 426C, and the intrinsic layer 424C of each PIN diode 420C have different thicknesses T5. T6, and T7. The thickness T6 of the intrinsic layer 424C may be greater than the thickness T5 of the lower doped layer 422C and/or the thickness T7 of the upper doped layer 426C. In yet further embodiments, as shown in FIG. 4D, the lower doped layer 422D, the upper doped layer 426D, and the intrinsic layer 424D of each PIN diode 420D have different thicknesses T8. T9, and T10. The thickness T8 of the lower doped layer 422D may be greater than the thickness T9 of the intrinsic layer 424D and/or the thickness T10 of the upper doped layer 426D.

FIG. 5A to FIG. 5D are perspective views of a PIN diode in accordance with various embodiments.

Figure 5B:
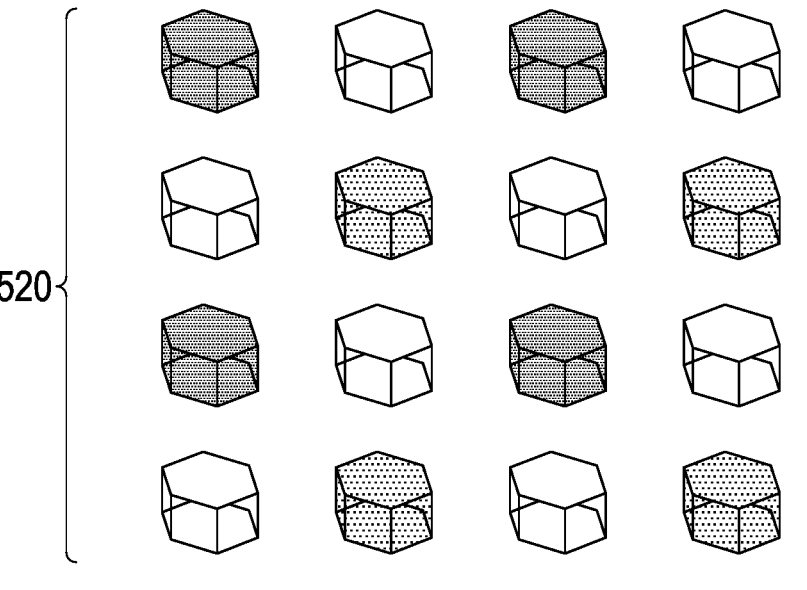
Figure 5C:
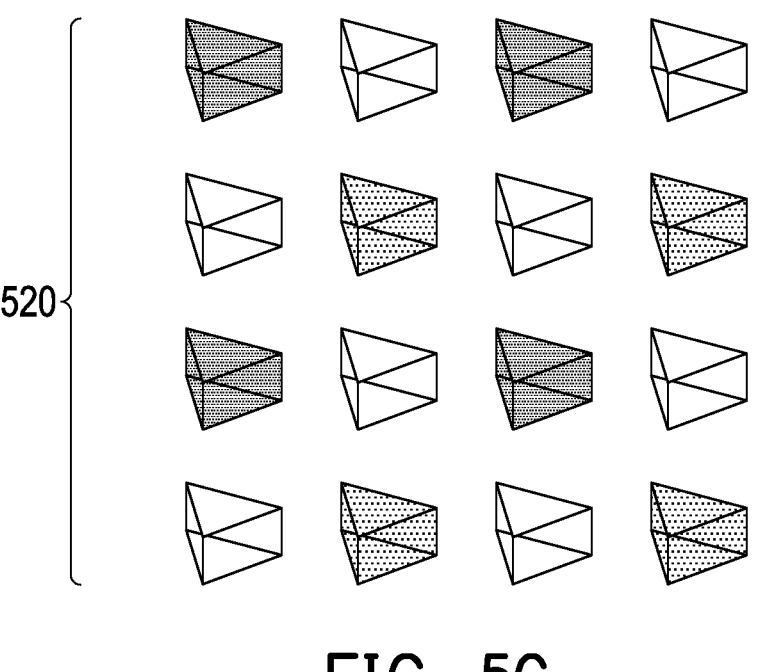
Figure 5D:
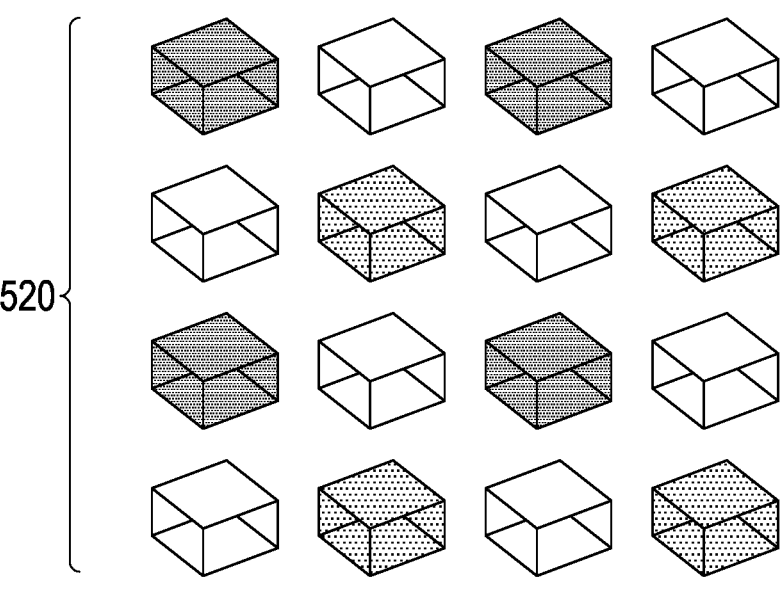

Referring to FIG. 5A, a plurality of PIN diodes 520 may be arranged in an array of a plurality of rows and a plurality of columns. Specifically, the PIN diodes 520 may include a plurality of first PIN diodes 520A, a plurality of second PIN diodes 520B, and a plurality of third PIN diodes 520C physically separated from each other. In some embodiments, the first PIN diodes 520A are configured to transmit light having a first wavelength range (e.g., red light) by applying a first bias voltage; the second PIN diodes 520B are con-figured to transmit light having a second wavelength range (e.g., green light) by applying a second bias voltage; and the third PIN diodes 520C are configured to transmit light having a third wavelength range (e.g., blue light) by apply-ing a third bias voltage. In some embodiments, the PIN diodes 520 may have the same shape or structure such as a cylindrical structure, as shown in FIG. 5A. However, the embodiments of the present disclosure are not limited thereto, in some alternative embodiments, the PIN diodes 520 may have a hexagonal column structure (as shown in FIG. 5B), a triangular column structure (as shown in FIG. 5C), or a rectangular column structure (as shown in FIG. 5D). Basically, the shape or structure of the PIN diodes 520 may be defined by the photolithography process and the etching process. Therefore, the shape or structure of the PIN diodes 520 is not limited to the above-mentioned shapes or structures. In some other embodiments, the PIN diodes 520 may have different shapes or structures. That is, the first PIN diodes 520A, the second PIN diodes 520B, and the third PIN diodes 520C may have different shapes or structures.

In accordance with an embodiment, an image sensor includes: a first substrate, having a first surface and a second surface opposite to each other; a plurality of photodetectors, disposed in the first substrate; and a plurality of color filters, disposed on the second surface of the first substrate and respectively corresponding to the plurality of photodetectors, wherein the plurality of color filters are composed of a plurality of PIN diodes, and the plurality of PIN diodes are configured to absorb light of different wavelength ranges by applying different bias voltages.

In accordance with an embodiment, a method of forming an image sensor includes: providing a first substrate having a first surface and a second surface opposite to each other; forming a plurality of photodetectors in the first substrate; forming a stack layer on the second surface of the first substrate; and patterning the stack layer to form a plurality of color filters respectively corresponding to the plurality of photodetectors, wherein the plurality of color filters are formed of a plurality of PIN diodes, and the plurality of PIN diodes are configured to absorb light of different wavelength ranges by applying different bias voltages.

In accordance with an embodiment, a color filter for an image sensor includes: a plurality of PIN diodes arranged in an array of a plurality of rows and a plurality of columns, wherein the plurality of PIN diodes comprise: a first PIN diode configured to transmit light having a first wavelength range by applying a first bias voltage; a second PIN diode configured to transmit light having a second wavelength range by applying a second bias voltage; and a third PIN diode configured to transmit light having a third wavelength range by applying a third bias voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:
a first substrate, having a first surface and a second surface opposite to each other;
a plurality of photodetectors, disposed in the first substrate; and
a plurality of color filters, disposed on the second surface of the first substrate and respectively corresponding to the plurality of photodetectors, wherein the plurality of color filters are composed of a plurality of PIN diodes.

2. The image sensor according to claim 1, wherein each PIN diode comprises:
a lower doped layer, having a first conductivity type;
an upper doped layer, disposed over the lower doped layer and having a second conductivity type; and
an intrinsic layer, disposed between the lower doped layer and the upper doped layer, wherein the intrinsic layer has a thickness of 30 nm to 80 nm.

3. The image sensor according to claim 2, wherein some lower doped layers of the plurality of PIN diodes are electrically connected to each other, and some upper doped layers of the plurality of PIN diodes are electrically connected to each other.

4. The image sensor according to claim 2, wherein a plurality of lower doped layers of the plurality of PIN diodes are electrically isolated from each other, and a plurality of upper doped layers of the plurality of PIN diodes are electrically isolated from each other.

5. The image sensor according to claim 2, wherein the first conductivity type is different from the second conductivity type.

6. The image sensor according to claim 1, further comprising:
an interconnect structure, disposed on the first surface of the first substrate;
a second substrate, bonded to the first substrate, so that the interconnect structure is disposed between the first substrate and the second substrate; and
a plurality of isolation structures, disposed in the first substrate to separate the plurality of photodetectors from each other.

7. The image sensor according to claim 1, wherein the plurality of PIN diodes comprise:
a first PIN diode having a first width of 80 nm to 150 nm;
a second PIN diode having a second width of 100 nm to 150 nm; and
a third PIN diode having a third width of 60 nm to 150 nm.

8. The image sensor according to claim 7, wherein the first PIN diode is directly disposed on the corresponding first photodetector, the second PIN diode is directly disposed on the corresponding second photodetector, and the third PIN diode is directly disposed on the corresponding third photodetector.

9. The image sensor according to claim 7, wherein the first PIN diode, the second PIN diode, and the third PIN diode have the same width and the same shape.

10. A method of forming an image sensor, comprising:
providing a first substrate having a first surface and a second surface opposite to each other;
forming a plurality of photodetectors in the first substrate;
forming a stack layer on the second surface of the first substrate; and
patterning the stack layer to form a plurality of color filters respectively corresponding to the plurality of photodetectors, wherein the plurality of color filters are formed of a plurality of PIN diodes.

11. The method according to claim 10, wherein the stack layer comprises:
a lower doped material layer, having a first conductivity type;
an upper doped material layer, disposed over the lower doped material layer and having a second conductivity type; and an intrinsic material layer, disposed between the lower doped material layer and the upper doped material layer, wherein the intrinsic material layer has a thickness of 30 nm to 80 nm.

12. The method according to claim 11, wherein after the patterning the stack layer, the upper doped material layer is divided as a plurality of upper doped layers, the intrinsic material layer is divided as a plurality of intrinsic layers, and the lower doped material layer is divided as a plurality of lower doped layers.

13. The method according to claim 12, wherein a remaining lower doped material layer remains between two adjacent lower doped layers, so that some lower doped layers are electrically connected to each other.

14. The method according to claim 12, further comprising:

forming a dielectric layer on the plurality of PIN diodes to encapsulate the plurality of PIN diodes;

patterning the dielectric layer to form a plurality of openings exposing the plurality of upper doped layers of the plurality of PIN diodes;

forming an electrode layer to fill in the plurality of openings and extend to cover a surface of the dielectric layer; and forming a first pad electrically connected to the electrode layer and a second pad electrically connected to the plurality of lower doped layers.

15. The method according to claim 11, wherein before forming the stack layer, the method further comprises:

forming a first interconnect structure on the first surface of the first substrate;

providing a second substrate having a second interconnect structure thereon;

contacting the first interconnect structure with the second interconnect structure to bond the first substrate and the second substrate together; and thinning the first substrate to expose the plurality of photodetectors at the second surface.

16. A color filter for an image sensor, comprising: a plurality of PIN diodes arranged in an array of a plurality of rows and a plurality of columns, wherein the plurality of PIN diodes comprise:

a first PIN diode having a first width of 80 nm to 150 nm;

a second PIN diode having a second width of 100 nm to 150 nm; and a third PIN diode having a third width of 60 nm to 150 nm.

17. The color filter according to claim 16, wherein the first PIN diode, the second PIN diode, and the third PIN diode have the same width.

18. The color filter according to claim 16, wherein the first PIN diode, the second PIN diode, and the third PIN diode have the same shape.

19. The color filter according to claim 16, wherein each PIN diode comprises:

a lower doped layer, having a first conductivity type;

an upper doped layer, disposed over the lower doped layer and having a second conductivity type; and an intrinsic layer, disposed between the lower doped layer and the upper doped layer, wherein the intrinsic layer has a thickness of 30 nm to 80 nm.

20. The color filter according to claim 19, wherein the lower doped layer, the upper doped layer, and the intrinsic layer of each PIN diode have the same thickness.

* * * * *